United States Patent
Brunet et al.

(10) Patent No.: US 7,320,936 B2
(45) Date of Patent: Jan. 22, 2008

(54) PLATING OF MULTI-LAYER STRUCTURES

(75) Inventors: Magall Brunet, Bellegarde (FR); Andrew Mark Connell, Cork (IE); Paul McCloskey, Cork (IE); Terence O'Donnell, Cork (IE); Stephen O'Reilly, County Cork (IE); Sean Cian O'Mathuna, Limerick (IE)

(73) Assignee: University College Cork - National University of Ireland, Cork, Cork (IE)

( * ) Notice: Subject to any disclaimer, the term of this patent is extended or adjusted under 35 U.S.C. 154(b) by 0 days.

(21) Appl. No.: 11/156,544

(22) Filed: Jun. 21, 2005

(65) Prior Publication Data

US 2005/0233593 A1    Oct. 20, 2005

Related U.S. Application Data

(63) Continuation of application No. PCT/IE03/00176, filed on Dec. 23, 2003.

(30) Foreign Application Priority Data

Dec. 23, 2002    (IE) .................................. 2002/0997

(51) Int. Cl.
*H01L 21/44* (2006.01)
(52) U.S. Cl. .............................. 438/678; 257/E21.114; 257/E21.464; 427/437; 427/443.1
(58) Field of Classification Search ................ 438/584, 438/591, 678, FOR. 390; 427/437, 443, 427/443.2; 257/E21.114, E21.464
See application file for complete search history.

(56) References Cited

U.S. PATENT DOCUMENTS

| 4,601,916 | A | * | 7/1986 | Arachtingi ................... 204/479 |
| 4,888,209 | A | * | 12/1989 | Neely .......................... 428/433 |
| 5,239,435 | A | | 8/1993 | Jeffers et al. ................ 360/126 |
| 5,252,195 | A | * | 10/1993 | Kobayashi et al. ......... 205/126 |
| 5,322,751 | A | * | 6/1994 | Chou et al. .................... 430/33 |
| 6,238,749 | B1 | * | 5/2001 | Willard et al. .............. 427/510 |
| 6,942,901 | B1 | * | 9/2005 | Van Tassel et al. ......... 427/458 |
| 2004/0151957 | A1 | * | 8/2004 | Brooks et al. ................ 429/20 |

FOREIGN PATENT DOCUMENTS

| EP | 0239839 A1 | 10/1987 |
| EP | 0373776 A2 | 6/1990 |

OTHER PUBLICATIONS

Electrophoretic Deposition by WWW.WIKIPEDIA.COM Search Word: Electrophoretic Deposition.*

* cited by examiner

*Primary Examiner*—W. David Coleman
*Assistant Examiner*—Su C. Kim
(74) *Attorney, Agent, or Firm*—Jacobson Holman PLLC

(57) ABSTRACT

An insulating layer (5) and a conductive seed layer (6) are applied to a substrate (1) in a simple process. A photo resist with palladium chloride are provided in a bath for electrophoretic deposition onto the substrate. The photo resist is an insulator and the palladium chloride is a catalyst. The layer is heated with UV to cure it. The layer is plasma etched to expose more of the palladium chloride, which acts as a catalyst for electrodes plating of the conductive seed layer. A thicker conductive layer (7) is then electroplated onto the seed layer. These steps may be repeated for successive insulating and/or conductive layers.

19 Claims, 5 Drawing Sheets

Cross sectional diagram of a planar micro-transformer device on silicon

Fig. 1: *Process steps for selective lamination of magnetic core*

*Cross sectional diagram of a planar micro-transformer device on silicon*

*Transformer devices in printed circuit board*

*Multi-layer magnetic structure on silicon produced by through-mask plating*

*Eagle layer before and after plasma etch (same magnification)*

*Optical image sandwich structure obtained*

*3D structure (170 microns tall), covered with laminated magnetic material*

PLATING OF MULTI-LAYER STRUCTURES

This is a continuation of PCT/IE03/000176 filed Dec. 23, 2003 and published in English.

FIELD OF THE INVENTION

The invention relates to plating of multi-layer structures.

PRIOR ART DISCUSSION

Many electronic devices utilise structures that consist of alternate layers of conductors (usually metals) and insulators. Examples include laminated magnetic cores and multilayer capacitors.

It is known in the art that laminated magnetic cores for integrated (on-chip) micro-magnetic components can be formed by sputtering, where successive layers of sputtered magnetic material and insulator (e.g. Silicon dioxide) can be deposited in one or more sputter operations. U.S. Pat. No. 5,239,435 describes a method in which layers of high permeability material are separated by very thin films of insulating magnetic material for high bit densities and data transfer rates in thin film magnetic record/playback heads. Sputtering is used as the deposition method for the insulating material. We believe that the formation of laminated structures by sputtering is both expensive and slow. Moreover the resulting laminated sheet is apparently difficult to pattern.

Laminated magnetic core structures can be formed using electroplating methods, by repeating the steps of (i) seed layer deposition, (ii) photoresist application and patterning, (iii) magnetic material electroplating, (iv) photoresist removal, (v) seed layer etch, (vi) spin coat, of insulation layer to cover magnetic material, for each separate lamination to be formed. The formation of laminated structures by electroplating methods requires many steps for the formation of each sheet. In particular, it requires a separate photolithographic step for each lamination. Thus the fabrication of multi-layers by this means would apparently be prohibitively expensive in terms of time and cost.

U.S. Pat. No. 5,435,903 describes a process for the electrodeposition of an amorphous cobalt-iron-phosphorus alloy. However an example given in the patent (example 12), describes the "Preparation of Laminate of Amorphous Alloy and Electroconductive Polymeric Material Electrolytic Solution (A) for Formation of Amorphous Alloy Layer". This "Laminate Film" consists of successive layers of "amorphous alloy" and "Electroconductive polymer". It appears that the electrodeposited polymer has an intermediate conductivity i.e. it is not fully an insulator or a conductor. Its conductivity is sufficiently high so as to permit the electrodeposition of the next layer of the amorphous magnetic material but is low enough to limit current flow through the layer. Such an approach has the disadvantage of limiting the deposition rates for the amorphous metal layers and also limiting the reduction in eddy current losses realised by the laminate structure.

U.S. Pat. No. 5,334,292 describes the utilisation of a porous conductive polymeric matrix, which includes dispersed colloidal catalytic particles to catalyse a reaction. Such a catalytic reaction involves subjection of reactants to this material in an electrochemically conductive or other context. The polymer film that is synthesised is electroconductive and in the particular case of polypyrrole, it is microporous. The authors explain that the use of microporous polymer (such as polypyrrole) is designed to afford good permeation of the substrate by gases such as $O_2$ and correspondingly respectable reaction cross-sections.

U.S. Pat. No. 5,239,435 describes a thin film magnetic record/playback head having suitably thin layers of soft, high permeability magnetic material, such as permalloy, electrically insulated from each other by very thin layers of a magnetic material having suitably high resistivity, such as NiZn ferrite. The magnetic record/playback head is capable of reading and writing much higher bit densities (up to about 100 kfci) and at much higher frequencies (100 MHz or higher) than prior art devices while remaining fully compatible with existing electronic circuitry. In this document the conflicting requirements of reducing the eddy currents by laminating magnetic structures with insulating layers and the corresponding reduction in the flux density is apparently overcome by employing a magnetic insulating layer (a nickel zinc ferrite). However only the permalloy can be deposited by electrodeposition. The Ferrite (a mixture of zinc nickel and iron oxides) is deposited by sputtering. This would apparently increase the processing costs markedly.

van Tassel J. Data A. Randall C A. *Electrophoretic deposition for fabrication of ultra-thin multi-component electroceramic tapes,* 1999 *International Symposium on Microelectronics.* Pages 647-652 describes a method of combining electrophoretic deposition with traditional tape casting and lamination processes to produce multilayer ceramic components. It appears that the high temperatures required for the processing of the ceramic material means that the approach is not suitable for applications in which it is a post processing stage for active silicon or in which compatibility with laminate materials is required.

SUMMARY OF THE INVENTION

According to the invention there is provided a method of applying layers to conductive areas of a substrate comprising the steps of:

(a) electrophoretically depositing an insulator together with a catalyst onto the substrate to provide an insulating layer; and (b) electroless plating a conductive layer onto the insulating layer, in which the catalyst activates the electroless plating.

In one embodiment, the insulating layer is activated before electroless plating of a conductive layer.

In one embodiment, the insulating layer is activated by plasma etching.

In one embodiment, the electrophoretically deposited insulator is a polymer.

In another embodiment, the electrophoretically deposited insulator is a photoresist.

In one embodiment, the insulating layer is electrophoretically deposited from an emulsion of insulator particles and the catalyst is in solution in the emulsion.

In a further embodiment, the electroless plated conductive layer is as a seed layer for further plating.

In one embodiment, the method comprises the further steps of electrodepositing conductor material on the seed layer, and subsequently repeating steps (a) and (b) for multiple insulator/conductor layers.

In one embodiment, the catalyst is selected from Group 8B of the Periodic Table.

In one embodiment, the catalyst comprises Palladium.

In one embodiment, the catalyst is palladium chloride, at a concentration to provide ions trapped within the insulator.

In another embodiment, the catalyst is diluted in a solution for pH adjustment for pH compatibility with the insulator.

In one embodiment, the insulator and the catalyst are electrophoretically deposited from a bath containing photo resist, palladium chloride, water, hydrochloride acid, and ammonia.

In one embodiment, the invention comprises the further steps of heating the insulating layer before step (b).

In one embodiment, the insulating layer is heated by a non-collimated UV source.

In one embodiment, the heating is performed in successive steps separated by intervals.

In one embodiment, the conductive areas of the substrate are a metal pattern.

In one embodiment, multiple conductor and insulator layers are applied.

In one embodiment, the conductor layer is magnetic and forms a laminated core of a magnetic component.

In one embodiment, the insulating layer is applied on vertical and horizontal surfaces.

In one embodiment, there are a plurality of conductive layers deposited as windings of a magnetic component.

In a further embodiment, the method comprises the further step of removing the substrate after electroless plating.

DETAILED DESCRIPTION OF THE INVENTION

BRIEF DESCRIPTION OF THE DRAWINGS

The invention will be more clearly understood from the following description of some embodiments thereof, given by way of example only with reference to the accompanying drawings in which.

DESCRIPTION OF THE EMBODIMENTS

The invention provides a method for fabricating multi-layer structures using plating technology. The approach plates an insulator in the form of a polymer that can be deposited electrophoretically. The polymer may have photoresist properties but this need not be the case. The electroplating bath from which the polymer is deposited also contains the necessary constituents so that a catalyst is co-deposited with the polymer. Subsequent processing such as plasma etch allows the catalyst to initiate an electroless deposition step. The electroless deposit can then provide the seed for further electro-deposition of metals or insulators.

Figure 1A:
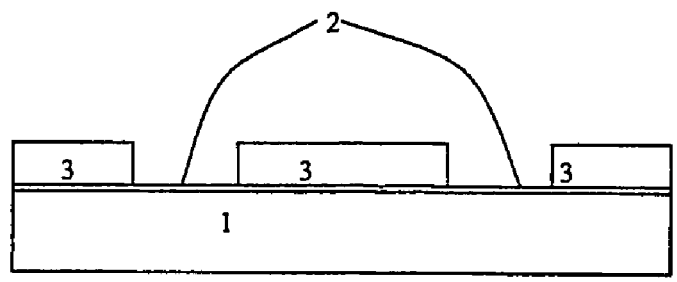
FIGS. 1(a) to 1(f) are a series of diagrams illustrating a lamination process of the invention.
Figure 1B:
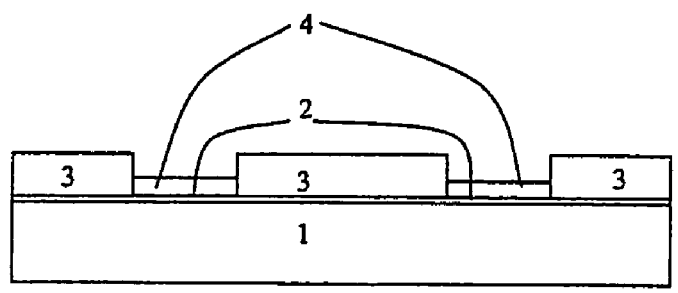
Figure 1C:
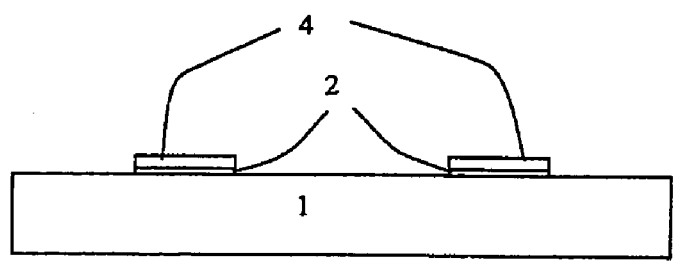
Figure 1D:
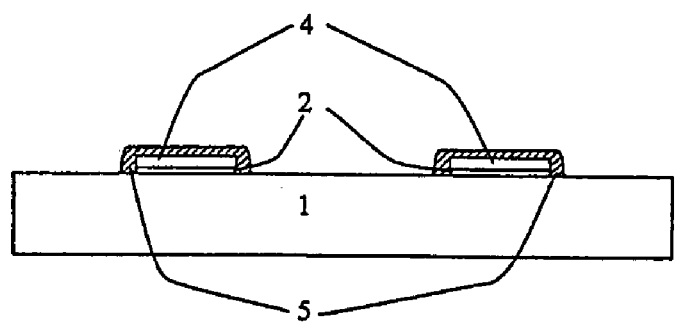
Figure 1E:
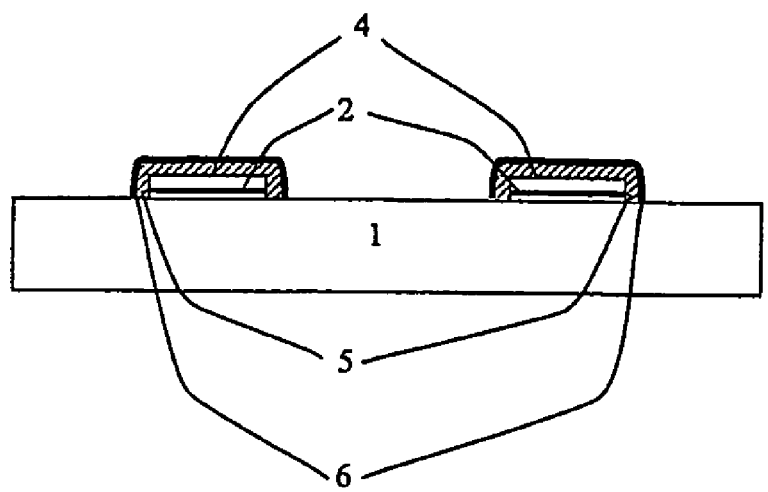
Figure 1F:
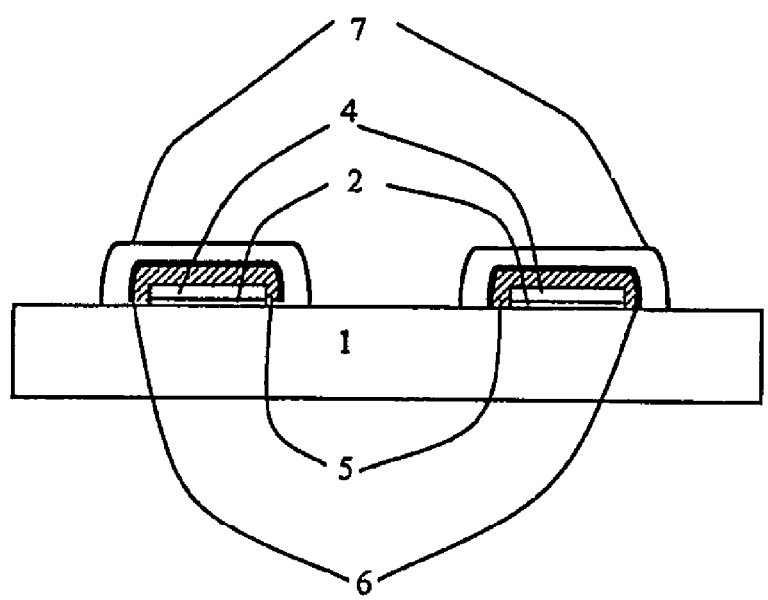

Referring to FIGS. 1(a) to 1(f), FIG. 1(a) represents a silicon wafer (1) sputtered with a metallic seed layer (2). Parts of the seed layer are selectively covered with a conventional photoresist (3). As shown in FIG. 1(b) the portions (2) of the sputtered wafer which are not covered with resist are selectively electroplated with magnetic alloy (4). As shown in FIG. 1(c) the resist (3) is then removed and the seed layer beneath it is etched away. The seed layer beneath the magnetic alloy remains. Electrical continuity to the magnetic layer (4) is maintained by a photo-patterned bus-bar arrangement (not shown). Referring to FIG. 1(d), a potential is applied across the magnetic alloy (4) which becomes selectively covered with a codeposit of an electrophoretically deposited polymer and an electroless plating catalyst. The polymer can be a photoresist material which can be patterned if necessary. This layer is dried to produce a coherent insulating layer (5). As shown in FIG. 1(e), activation of the electrophoretically applied layer is achieved by plasma etching which removes the surface layer of polymer to expose the catalyst particles. The wafer is then immersed in an electroless plating solution to form a conductive seed layer (6) selectively over the insulating layer. As shown in FIG. 1(f) the electroless seed layer is then electroplated with magnetic alloy to form the second layer of a laminated magnetic structure (7).

Figure 2:
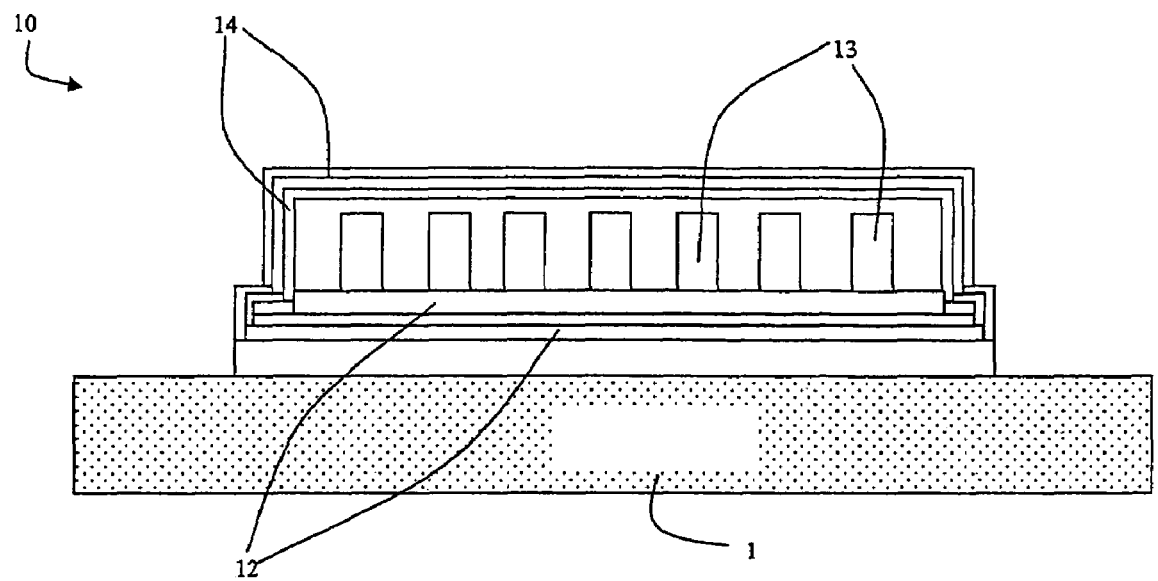
FIG. 2 is a cross-sectional diagram of a planar micro-transformer produced by the method of the invention.

A device which can be made in the above process is a planar micro-transformer 10, shown in FIG. 2. The device 10 comprises a silicon substrate 11, insulator layers 12, Cu windings 13, and magnetic cores 14. The polymer forms the insulation layers, and the conductive layers are formed by electroplating on the Ni seed layer.

Figure 3:
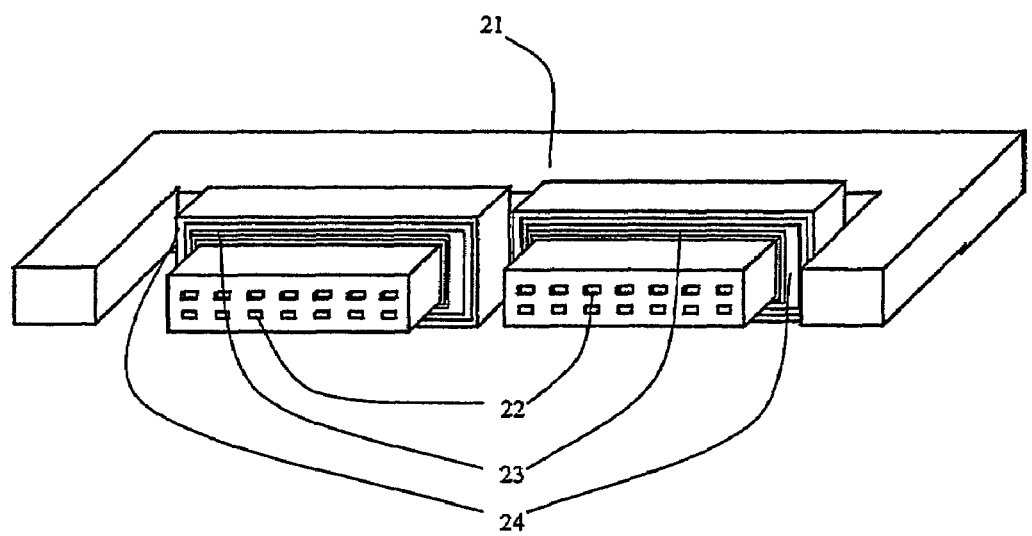
FIGS. 3 and 4 are perspective and cross-sectional diagrams of other devices produced by a method of the invention.

The invention is particularly useful in the formation of laminated 3-dimensional structures of the type shown in FIG. 3. The following are the layers of the device of FIG. 3.

21 Double sided printed circuit board with cut-outs around the windings.
22 Embedded copper windings with racetrack configuration.
23 Electrophoretically applied polymer/catalyst insulating layer.
24 Laminated magnetic material with two laminations.

Figure 4:
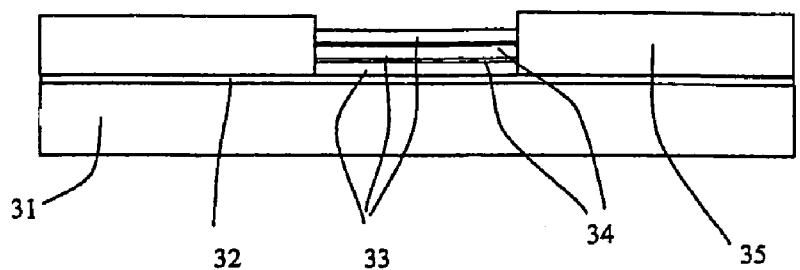

The invention could also be used for through mask plating, as shown in FIG. 4.

The following are the layers of the device of FIG. 4:
31 Silicon substrate
32 Sputtered seed layer
33 Magnetic material
34 Electrophoretic co-deposit of polymer and electroless plating catalyst.
35 Insulating mask produced from conventional photo resist.

It will be appreciated that the invention avoids the expense of using vacuum techniques such as sputtering and also avoids the requirement for multiple photo-lithographic steps.

In one embodiment Eagle 2100ED™ photo-resist was used to fabricate laminated magnetic structures for use in micro-transformer cores. The laminated structure consists of NiFe/Insulator/NiFe, the insulator being the Eagle 2100ED™. The process for fabricating the laminated structure consists of the following steps:

1. Electrodeposition of NiFe layer.
2. Co-deposition of insulator and catalyst (in this case Palladium) for subsequent electroless step.
3. Pre-treatment of insulator.
4. Electroless Nickel deposition (acts as seed layer for subsequent Ni/Fe layer).
5. Electrodeposition of NiFe layer.

Eagle 2100ED™ photo resist is an aqueous based photoresist emulsion produced by Shipley. It is applied onto electrically conductive substrates by cathodic electrodeposition. The deposited photoresist film is a negative acting photopolymer.

Co-Deposition of Palladium and Eagle 2100ED™

The organic material in the photo resist bath is made up of micelles carrying ionisable amine groups. In the presence of acid, the amino groups of the polymer become positively charged. On applying a voltage across a cell, the positively charged micelles of polymer migrates towards the cathode (−) by electrophoresis. When they reach the cathode, the micelles lose their charge and coagulate, forming a coating on the cathode.

Palladium Chloride was chosen to be included in the photo resist bath because $Pd^{2+}$ ions are formed from the dissolution of $PdCl_2$ in hydrochloric acid. These positive ions are attracted to the cathode (−) and reduced on the substrate at the same time as the photo resist or stay as ions trapped in the photo resist layer. The presence of Pd in the layer (metal form or ion form) provides the activation for subsequent electroless deposition of metal.

On the other hand, the photo resist bath has a pH of 4, so anything added in the bath should be neutral to avoid unwanted reactions during the electrophoresis process. Hence, after dissolving the Palladium Chloride in diluted HCl, Ammonia was added to bring the pH of the diluted palladium solution to 6. The solution was then added to the photo resist emulsion.

Consequently the bath used had the following composition:

| | |
|---|---|
| Eagle resist | 600 mL |
| $PdCl_2$ | 0.1 g |
| Water | 200 mL |
| HCl | 1 mL/L |

Ammonia (pH to 6)

Several electro-deposition voltages were tried, namely 50V, 40V and 30V. In all cases, the bath temperature used was 30° C., since this gives a thinner deposit than a bath temperature of 25° C. From these experiments it was found that 30V gave the best deposit (50V gave a rough deposit). Stirring during deposition also assisted in reducing pinholes and helped to make the deposit smoother.

Figure 5:
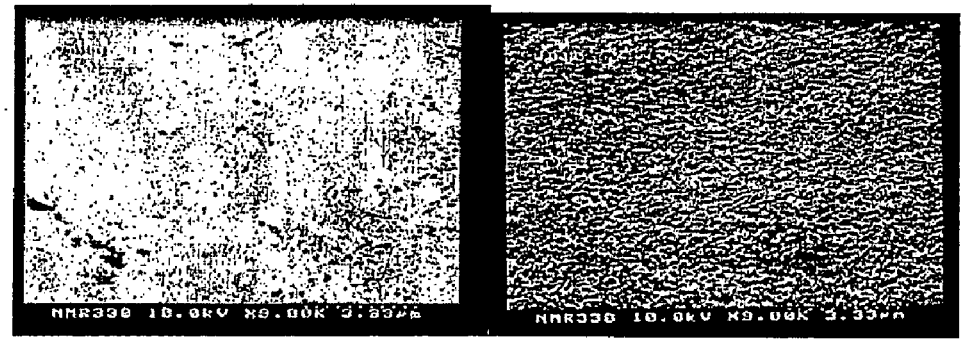
FIG. 5 is a pair of photographs of the same magnification showing a structure before and after plasma etch in a process of the invention.

Pre-Treatment of Insulator (FIG. 5)

Crossliking of the photo resist is necessary to produce a chemically resistant layer. This was achieved by exposure to UV (exposure dose of 5000 $mJ/cm^2$) and a hardbake at 250° C. under $N_2$ for 1 hour. The irradiation with light of a suitable wavelength range cross-links the photoresist to form an insoluble network which cannot be removed under standard developing conditions. This is achieved using a broadband UV exposure tool. The crosslinked layer is resistive to developing solutions (in the case of Eagle, Lactic acid based solution) but is not resistive to further processing such as the plasma etching and to solvents such as acetone and IPA.

However a hardbake for 1 hour on a hotplate at 250° C. under $N_2$ was found to give a very resistant layer. The insulating layer changes colour when ramping up the hotplate, around 200° C.: the dye may be decomposing at that stage. After this hardbake, the layer is resistant to acetone and IPA even if the sample is immersed for few hours.

In order to make the co-deposited Palladium available to initiate the electroless Nickel deposition the insulator layer was ashed in a "Plasmod" plasma etcher for 25 min at 200 W. The plasma etch removes organic material and leaves heavy elements such as Palladium on the surface. It is also possible that the reactive species in the plasma may produce chemical reactions with the Palladium. For example if the palladium in the deposit was still in the ionic form, chemical reaction could lead to Pd metal or PdO. Both materials are catalysts for electroless nickel deposition.

Experiments were carried out to determine the removal rate and consequent activation level, for photoresist that had been exposed to UV (dose 5000 $mJ/cm^2$) and hardbaked at 250° C. under $N_2$ for 1 hour. Samples of deposited photoresist were exposed to ashing times of 5, 10, 15, 20, 25 and 30 min and the thickness of the respective areas were measured using a "Tencor" profilometer. It was found that for a power of 200 W and a level of oxygen gas of 23 standard cubic centimetres per minute, the average ashing rate was 0.1 µm/min.

This slow ashing rate is due to the durability of the layer resulting from the hard bake. The activation level was determined for these samples by dipping the wafer into an electroless Nickel solution (Niposit) and checking the coverage of Nickel achieved. It was found that 20 min in the Plasmod gave good coverage. For times less than 15 minutes, the plating was not complete.

Figure 6:
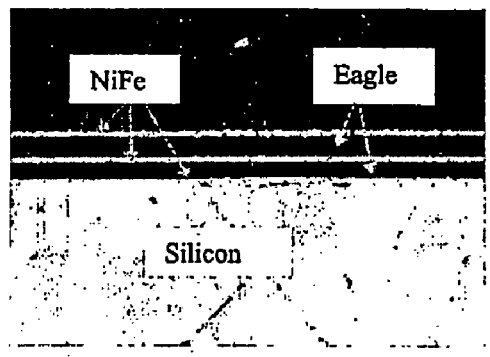
FIG. 6 is a photograph showing a "sandwich" structure at a stage of the process.

"Sandwich" Structure Achieved (FIG. 6)

A laminated structure of metal (8 microns Ni/Fe) and insulator (6 microns photoresist) was produced by the method described above.

Figure 7:
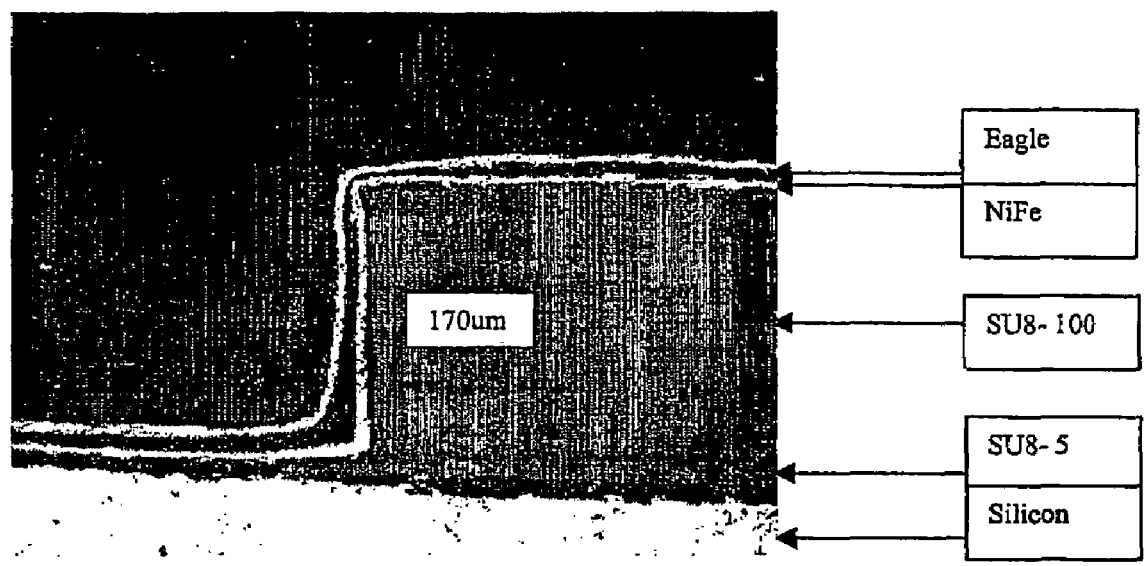
FIG. 7 is a photograph showing a 3D structure covered with laminated magnetic material.

Experiments of Lamination on 3D Structures (FIG. 7)

The process of lamination using electrophoretic deposition of an insulator is also applicable on 3D structures. To demonstrate this, structures with vertical side walls were created using SU8 (photosensitive epoxy) and the lamination process explained previously was applied on top of these structures.

Preparation of Substrate: Creation of 3D Structures.

First, the silicon wafer is insulated using SU8-5 (low viscosity epoxy). SU8-100 is then spun on with a thickness of 170 microns and patterned. A seed layer of Titanium and Copper is then sputtered on the structures.

Lamination Process:

The metallic material is electroplated: in this case again, NiFe is used. The next step is the electrophoresis deposition of the Palladium-filled Eagle resist. To avoid any reflow of the resist on acute corners, the pre-bake is suppressed and the UV flood which will crosslink the polymer is done 5 min by 5 min (the photoresist would get hot under long exposure to UV light). A non-collimated UV source is necessary so the resist can be crosslinked everywhere even when deposited on the vertical side walls.

The activation, electroless Ni and electroplating of NiFe are done the same way as on flat surfaces.

FIG. 7 shows a cross-section of the resulting sample. The NiFe layers are 6 µm thick. A reasonably even layer of resist was deposited on 3D structures: on acute corners, the layer is slightly thinner but still covers the metal underneath. As a result, the two metallic layers are insulated from each other.

It will be appreciated that the invention provides for simple and effective plating of alternate insulating and conductive layers. The method is also very versatile, allowing plating of vertical surfaces for forming circuits or components as desired.

The invention is not limited to the embodiments described but may be varied in construction and detail.

The invention claimed is:

1. A method of applying layers to conductive areas of a substrate comprising the steps of:
   (a) electrophoretically depositing an insulator onto said conductive areas of the substrate to provide an insulating layer, wherein a catalyst is co-deposited with the insulating layer, and wherein the insulating layer is electrophoretically deposited from an emulsion of insulator particles, and the catalyst is dissolved in solution in the emulsion; and (b) electroless plating a conductive layer onto the insulating layer, in which the catalyst activates the electroless plating;

wherein the insulating layer is activated before electroless plating of the conductive layer; and wherein the insulating layer is activated by plasma etching to remove a surface portion of the insulating layer to expose the catalyst.

2. The method as claimed in claim 1, wherein the electrophoretically deposited insulator is a polymer.

3. The method as claimed in claim 1, wherein the electrophoretically deposited insulator is a photoresist.

4. The method as claimed in claim 1, wherein the electroless plated conductive layer is as a seed layer for further plating.

5. The method as claimed in claim 4, comprising the further steps of electrodepositing conductor material on the seed layer, and subsequently repeating steps (a) and (b) for multiple insulator/conductor layers.

6. The method as claimed in claim 1, wherein the catalyst is selected from Group 8B of the Periodic Table consisting of iron, cobalt, nickel, ruthenium, rhodium, palladium, osmium, iridium and platinum.

7. The method as claimed in claim 1, wherein the catalyst comprises Palladium.

8. The method as claimed in claim 1, wherein the catalyst comprises Palladium; and wherein the catalyst is palladium chloride, at a concentration to provide ions trapped within the insulator.

9. The method as claimed in claim 1, wherein the catalyst is diluted in a solution for pH adjustment for pH compatibility with the insulator.

10. The method as claimed in claim 1, wherein the catalyst comprises Palladium; and wherein the insulator and the catalyst are electrophoretically deposited from a bath containing photo resist, palladium chloride, water, hydrochloride acid, and ammonia.

11. The method as claimed in claim 1, comprising the further steps of heating the insulating layer before step (b).

12. The method as claimed in claim 1, wherein the insulating layer is exposed to a UV source.

13. The method as claimed in claim 1, comprising the further steps of heating the insulating layer before step (b); and wherein the heating is performed in successive steps separated by intervals.

14. The method as claimed in claim 1, wherein the conductive areas of the substrate are a metal pattern.

15. The method as claimed in claim 1, wherein multiple conductor and insulator layers are applied.

16. The method as claimed in claim 1, wherein the conductor layer is magnetic and forms a laminated core of a magnetic component.

17. The method as claimed in claim 1, wherein the insulating layer is applied on vertical and horizontal surfaces.

18. The method as claimed in claim 1, wherein there are a plurality of conductive layers deposited as windings of a magnetic component.

19. A method of applying layers to conductive areas of a substrate, the method comprising the steps of:

(a) electrophoretically depositing an insulator onto said conductive areas of the substrate to provide an insulating layer, wherein a catalyst is co-deposited with the insulating layer; and (b) electroless plating a conductive layer onto the insulating layer, in which the catalyst activates the electroless plating, wherein the insulating layer is activated by plasma etching to remove a surface portion of the insulating layer to expose the catalyst before electroless plating of the conductive layer.

* * * * *